(12) United States Patent
Kunii et al.

(10) Patent No.: US 7,042,053 B2
(45) Date of Patent: May 9, 2006

(54) SEMICONDUCTOR DEVICE WITH POLYMER INSULATION OF SOME ELECTRODES

(75) Inventors: Tetsuo Kunii, Tokyo (JP); Ryo Hattori, Tokyo (JP); Hiroshi Kawata, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/724,056

(22) Filed: Dec. 1, 2003

(65) Prior Publication Data

US 2004/0108556 A1 Jun. 10, 2004

(30) Foreign Application Priority Data

Dec. 4, 2002 (JP) .............................. 2002-352573

(51) Int. Cl.
*H01L 29/76* (2006.01)
*H01L 29/94* (2006.01)
(52) U.S. Cl. ....................... 257/401; 257/382
(58) Field of Classification Search ............... 257/382, 257/401
See application file for complete search history.

(56) References Cited

U.S. PATENT DOCUMENTS 6,071,809 A * 6/2000 Zhao ........................... 438/634
6,483,176 B1 * 11/2002 Noguchi et al. ............. 257/666
6,664,624 B1 * 12/2003 Haematsu .................... 257/700

OTHER PUBLICATIONS

Loke et al., "Copper Drift In Low-K Polymer Dielectrics for ULSI Metallization," *1998 Symposium on VLSI Tech.*, Jun. 9-11, 1998, Honolulu, HI.
Web Page: Ireland Integrated Circuit Technology Research Institute NMRC, pp. 1-2, Oct. 10, 2003.

* cited by examiner

*Primary Examiner*—Hung Vu
(74) *Attorney, Agent, or Firm*—Leydig, Voit & Mayer, Ltd.

(57) ABSTRACT

A semiconductor device includes a semiconductor substrate having a principal plane on which gate, source, and drain electrodes are located. A film made of a polymer with a low dielectric constant is over the gate and drain electrodes to insulate the gate and drain electrodes from the source electrodes. A chip surface electrode located over the low-dielectric-constant polymer film and the source electrode, and connected to ground potential. The source electrode is provided with the ground potential through the chip surface electrode.

8 Claims, 16 Drawing Sheets

SEMICONDUCTOR DEVICE WITH POLYMER INSULATION OF SOME ELECTRODES

BACKGROUND OF THE INVENTION

1. Field of the Invention

The present invention relates to a semiconductor device including transistors, each transistor having a plurality of electrodes.

2. Description of the Background Art

FIG. 14 is a plan view of a conventional semiconductor chip on which a plurality of field effect transistors (FETs) are formed, and shows an electrode arrangement of FETs formed on the semiconductor chip. FIG. 15 is a sectional view of the semiconductor chip when viewed from the side.

As shown in FIG. 14, gate electrodes 5, drain electrodes 6 and source electrodes 7 of FETs are arranged on a semiconductor substrate 1. The gate electrode 5, drain electrode 6 and source electrode 7 are connected to a gate pad 2, drain pad 3 and source pad 4, respectively. The gate pad 2 and source pad 4 are alternately arranged as shown in FIG. 14. A via hole 9 is formed in the source pad 4.

As shown in FIG. 15, the via hole 9 is formed in the semiconductor substrate 1 and under the source pad 4. The via hole 9 is connected to a heat sink 10 attached on a grounded back plane of the semiconductor substrate 1. Thus, the source electrode 7 is grounded through the source pad 4 and the via hole 9.

These semiconductor chips are die-bonded on a substrate of a package by AuSn solder or the like. The gate pad 2 and drain pad 3 are connected to a lead section of the package through a printed board and so on via wire bonding. This forms a DC signal line and an RF signal line.

In the conventional semiconductor chip described above, since the source electrodes 4 are grounded by using the back plane heat sink 10, the via hole 9 for electrically connecting the source electrode to the heat sink 10 must be formed in the semiconductor substrate 1 as shown in FIG. 15, thus to make a structure and manufacturing process of the semiconductor chip more complex.

Further since the source pads 4 for forming the via holes 9 must be formed on the front plane of the semiconductor chip, the gate pads 2 and source pads 4 have to be alternately arranged. Hence, every gate pad 2 must be wire-bonded and therefore the assembly process become complex and the characteristics caused by variation of wire-bonding lengths is degraded.

As shown in FIG. 14, 10 to 20 source electrodes in an FET operating area 8 are grounded for one set via hole 9, and thus a gain is decreased with an increase in source inductance (Ls) in a high-frequency band higher than 10 GHz.

In addition, as shown in FIG. 16, when a semiconductor chip is die-bonded to the substrate of a package by an AuSn solder in assembly of a device, camber occurs due to a difference of thermal expansions between the semiconductor substrate 1 and the back plane heat sink 10, the thickness of solder on each end of the semiconductor chip increases, and the heat resistance of the device disadvantageously increases.

SUMMARY OF THE INVENTION

The present invention has been made to solve the above problem, and has its object to provide a semiconductor device which can simplify the structure of the semiconductor device to easily realize the facility of the manufacturing process. It is another object of the present invention to provide a semiconductor device which can suppresses the occurrence of camber in a die-bonding process for a semiconductor chip.

In the first aspect of the invention, provided is a semiconductor device on which a plurality of semiconductor elements each having first and second main electrodes and a control electrode are arranged. A semiconductor substrate has one principal plane on which the first and second main electrodes and the control electrode are formed. A film is formed over the first main electrode and the control electrode so as to insulate the first main electrode and the control electrode from the second main electrode, and is made of polymer material with a low dielectric constant. A chip surface electrode is formed over the film and the second main electrode and connected to a ground potential. The second main electrode is provided with the ground potential through the chip surface electrode.

In the first semiconductor device, a first pad connected to the first electrode and a second pad connected to the second electrode may be formed on a principal plane on the opposite side of the principal plane on which the electrodes of the semiconductor substrate are formed. Further, the semiconductor substrate may be made from SiC or sapphire.

In the second aspect of the invention, provided is a semiconductor device on which a plurality of semiconductor elements each having first and second main electrodes and a control electrode are arranged. A semiconductor substrate has one principal plane on which the first and second main electrodes and the control electrodes are formed. A protecting film is formed over the first and second main electrodes and the control electrodes, and made of polymer material with a low dielectric constant.

In the third aspect of the invention, provided is a semiconductor device on which a plurality of semiconductor elements each having first and second main electrodes and a control electrode are arranged. A semiconductor substrate has one principal plane on which the first and second main electrodes and the control electrodes are formed. A metal layer is formed on a principal plane on the opposite side of the principal plane of the semiconductor substrate, and is grounded. A film is formed over the first and second main electrodes and the control electrodes, and is made of polymer material with a low dielectric constant. A surface layer is formed on the film made of polymer material with a low dielectric constant, and is made of the same material as that of the grounded metal layer.

In the third semiconductor device, the surface layer may be electrically connected to the grounded metal layer.

According to the present invention, unlike a prior art, since via holes need not be formed in a semiconductor substrate unlike a conventional semiconductor substrate, a semiconductor chip structure can be simplified, and the chip manufacturing process can be simplified. Furthermore, according to the present invention, since camber in a die-bonding process for the semiconductor device can be reduced, an AuSn solder between a heat sink on the back plane of the chip and a package is uniformly formed to have a small thickness, and the heat resistance of the device can be reduced.

DESCRIPTION OF THE PREFERRED EMBODIMENTS

Semiconductor devices according to embodiments of the present invention will be described below with reference to the accompanying drawings.

First Embodiment

Figure 1A:
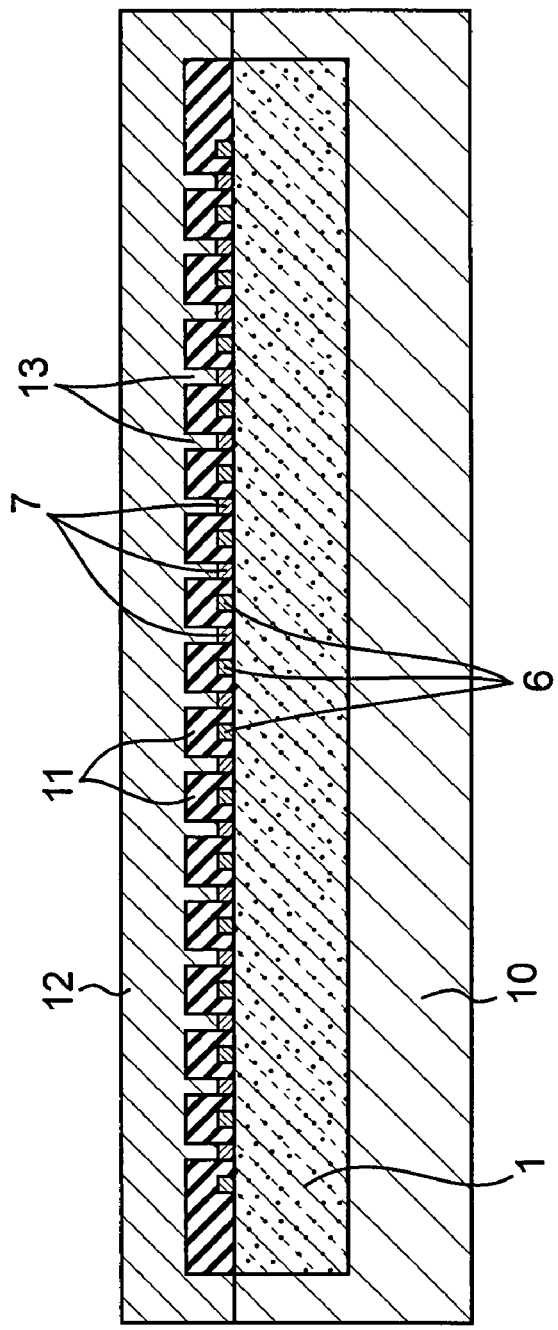
FIG. 1A is a sectional side view showing a structure of a semiconductor device according to the first embodiment of the present invention.
Figure 1B:
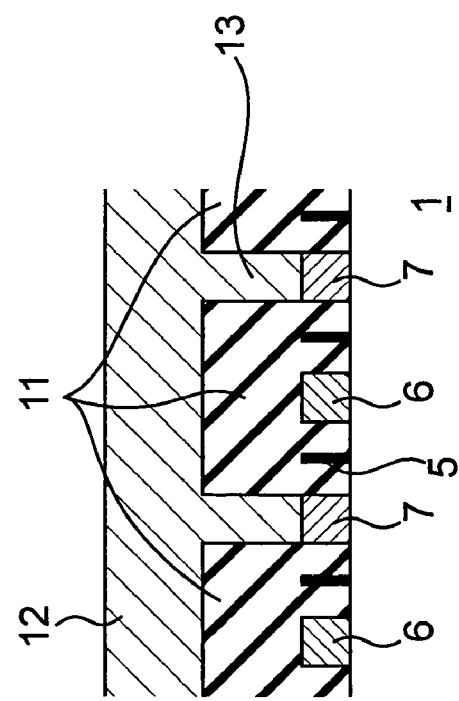
FIG. 1B is a partially enlarged view of a section of the semiconductor device according to the first embodiment.
Figure 2:
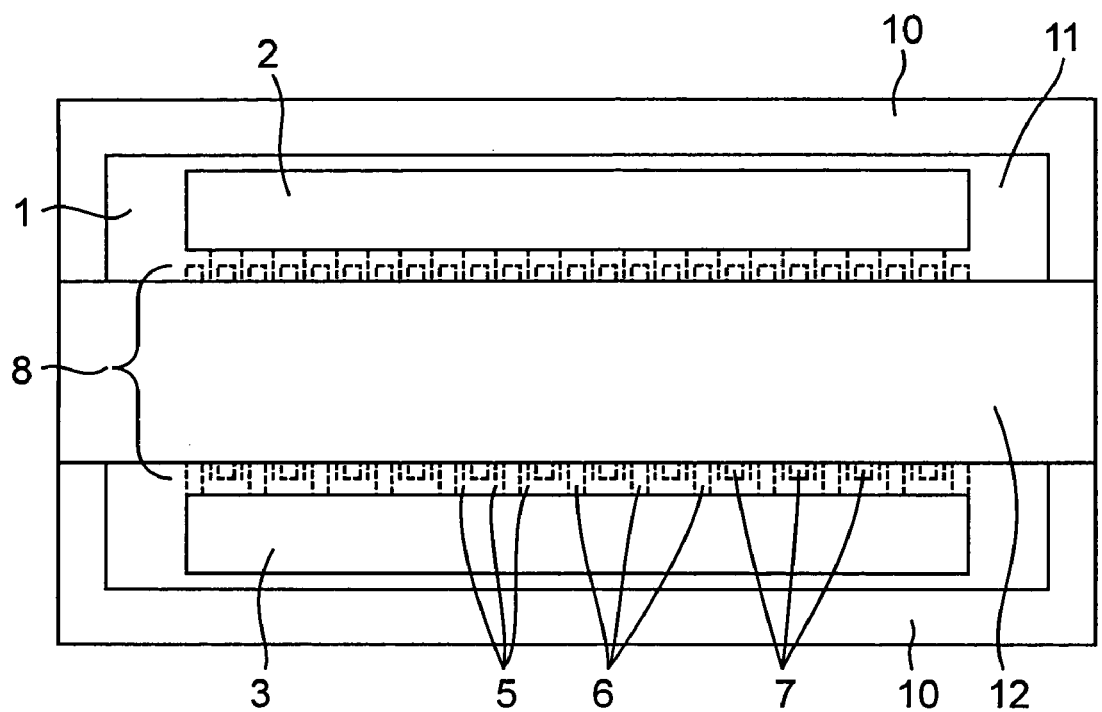
FIG. 2 is a top view of the structure of the semiconductor device according to the first embodiment of the present invention.

A semiconductor device according to the present invention has a plurality of field effect transistors (FETs) formed thereon. FIG. 1A is a sectional side view showing the structure of the semiconductor device according to the present invention. FIG. 1B is a partially enlarged view of a section of the semiconductor device. FIG. 2 is a top view showing the structure of the semiconductor device of the present invention.

As shown in FIGS. 1 and 2, gate electrodes 5 serving as control electrodes of FETs and drain electrodes 6 and source electrodes 7 serving as main electrodes of the FETs are arranged on a semiconductor substrate 1. The drain electrodes 6 and the source electrodes 7 are alternately arranged, and the gate electrodes 5 are arranged between the electrodes 6 and 7. It should be noted that in FIG. 1A the gate electrodes 5 are omitted for the sake of visual convenience (as well as FIG. 8, FIG. 11, and the like). In FIG. 1B, a partially enlarged view of the section of the semiconductor device is shown for easily understanding an electrode arrangement.

A heat sink 10 is provided on the back plane of the semiconductor substrate 1, and a chip surface ground electrode 12 is provided on the front plane of the semiconductor substrate 1. The heat sink 10 and the chip surface ground electrode 12 are both formed by Au plating. The heat sink 10 is grounded, and the chip surface ground electrode 12 is grounded through the heat sink 10. The chip surface ground electrode 12 is electrically connected to the source electrode 7 by a support section 13. Thus, the source electrode 7 is connected to the heat sink 10 through the chip surface ground electrode 12 thus to be grounded.

As shown in FIG. 1B with the enlarged view, the gate electrode 5 is arranged between the drain electrode 6 and source electrode 7. A film (low-dielectric-constant polymer film) 11 which is made of polymer material with a low dielectric constant is formed between the adjacent source electrodes 7 to cover the gate and drain electrodes 5 and 6. In this case, the low-dielectric-constant polymer material may preferably be polymer material with a dielectric constant of 4 or less (more preferably, 3 or less), and includes, for example, BCB (Benzo Cyclo Butene) or a polyimide-based material. The low-dielectric-constant polymer film 11 insulates the chip surface ground electrode 12 from the gate and drain electrodes 5 and 6, and electrically connects the chip surface ground electrode 12 only to the source electrode 7.

As described above, since the source electrode 7 is grounded through the chip surface ground electrode 12 connected to the heat sink 10, via holes need not be formed in the semiconductor substrate 1 unlike a conventional semiconductor device. Since the via holes need not be formed, the semiconductor chip structure can be simplified, and a manufacturing process of the chip can become simple. In addition, source pads need not be arranged on the semiconductor substrate 1, that is, the chip surface.

Figure 14:
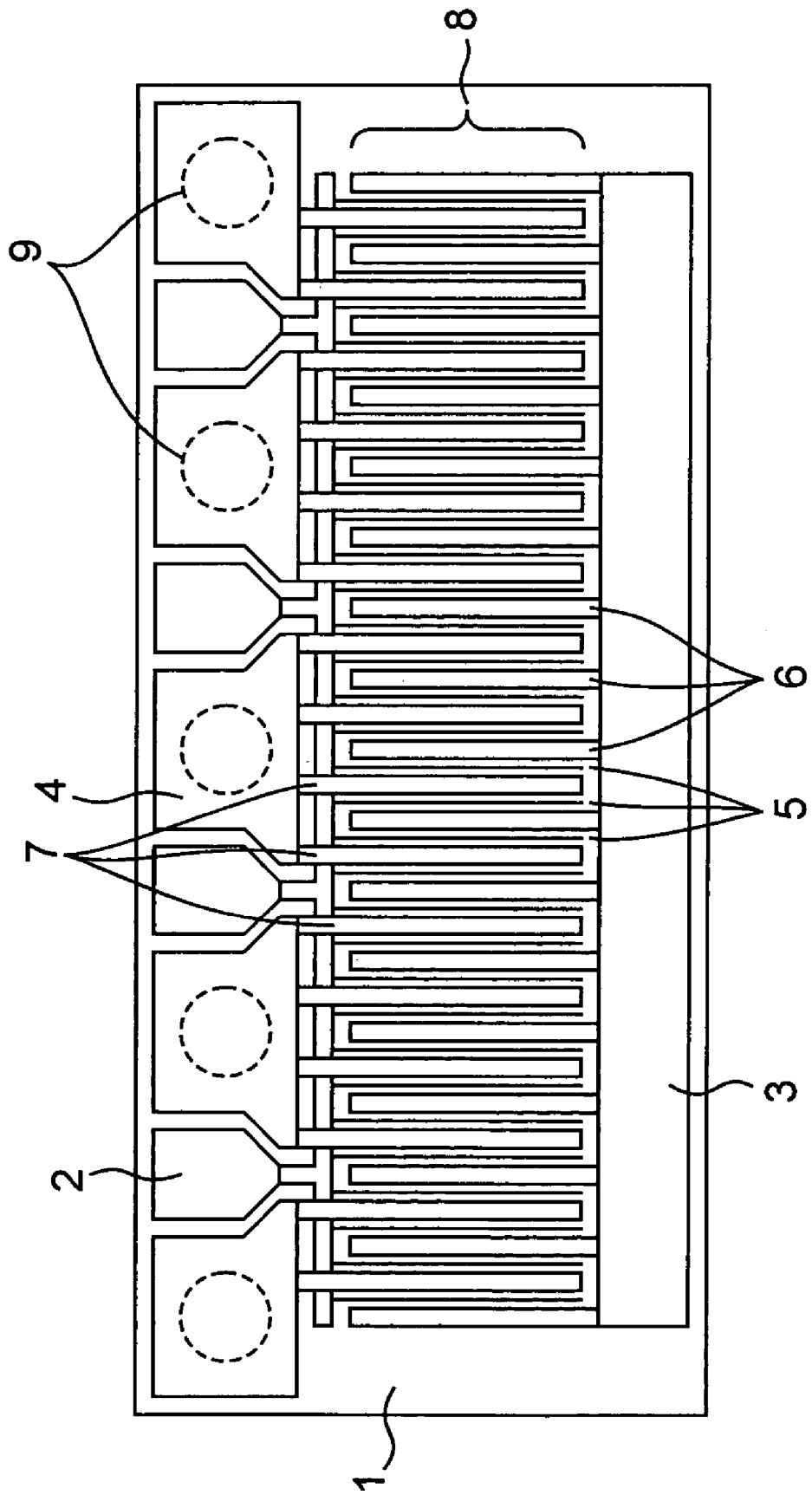
FIG. 14 is a plan view of a conventional semiconductor device (chip) on which electronic devices such as transistors are formed.
Figure 15:
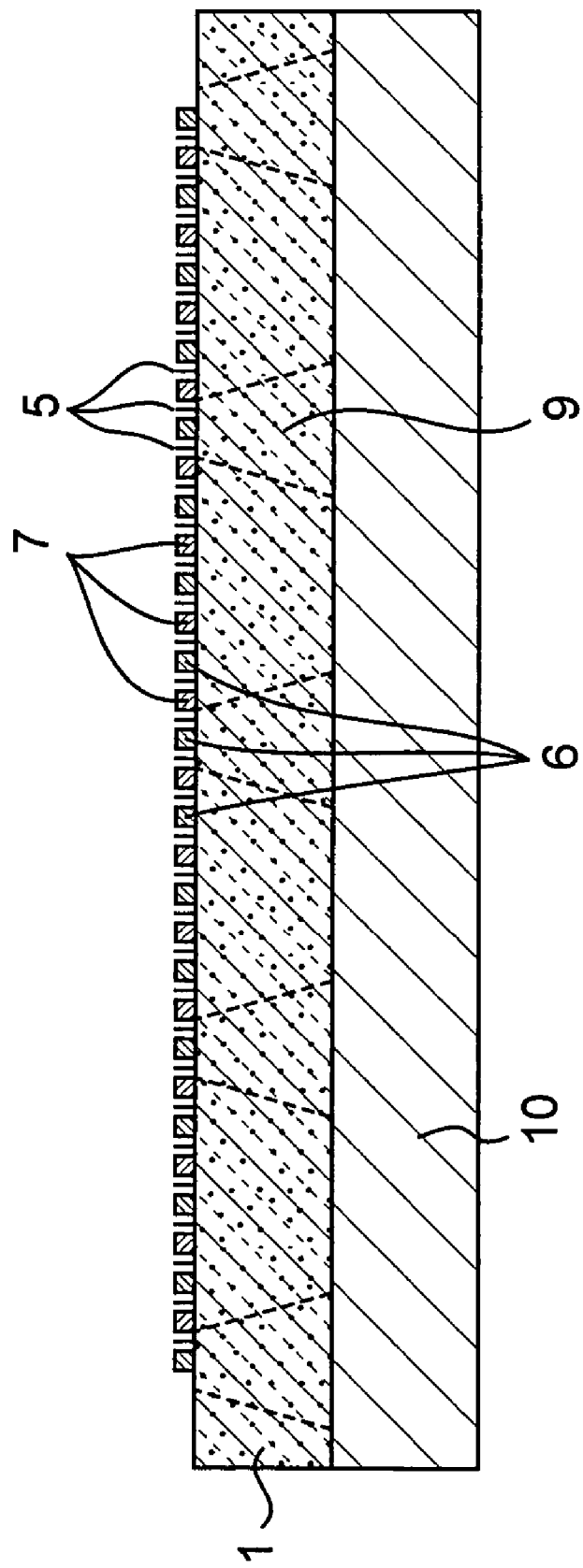
FIG. 15 is a sectional side view showing a conventional semiconductor device (chip).
Figure 16:
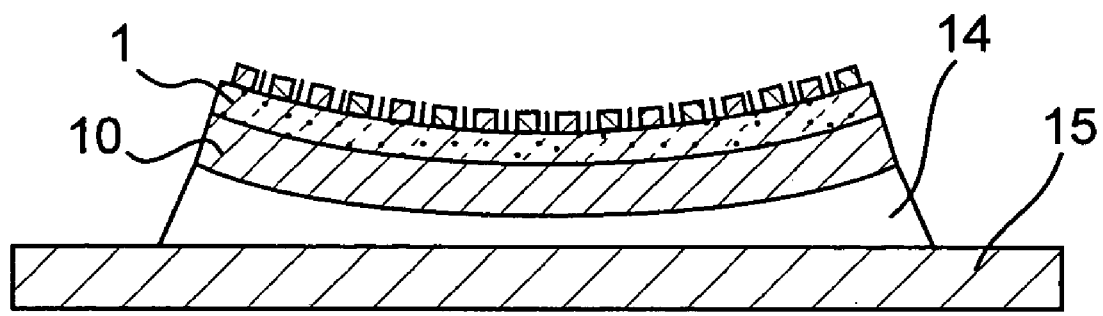
FIG. 16 is a view for explaining occurrence of camber in a die-bonding process for a conventional semiconductor device (chip).

As shown in FIG. 2, a gate pad 2 connected to the gate electrodes 5 and a drain pad 3 connected to the drain electrodes 6 are formed on the semiconductor substrate 1. In a prior art shown in FIG. 14, a plurality of gate pads 2 are formed to interpose a source pad 4. However, according to this embodiment, since the source pad 4 need not be formed on the chip surface, as shown in FIG. 2, one landscape gate pad 2 can be formed to make it possible to simplify the shape of the gate pad.

In the prior art, a plurality of gate pads have to be wire-bonded, respectively. On the contrary, according to this embodiment, only one gate pad may be used, and thus wire-bonding to each gate pad is not needed and it is possible to facilitate connection of one gate pad to an alignment substrate by using a tag tape or the like. Hence, the manufacturing process can be simplified, and characteristic deterioration due to variation of wire-bonding lengths can be suppressed. In addition, since the source electrode 7 in an operating area 8 of the transistor can be directly connected to the chip surface ground electrode 12 and grounded, a source inductance can be made smaller than that in the conventional structure in which a source electrode is grounded through a via hole. This can achieve a high gain in a high-frequency band in particular higher than 100 GHz.

As the material of the semiconductor substrate 1, SiC or sapphire is preferable because a high output semiconductor device can be easily manufactured with these materials.

Although these materials are used to form a GaN-based device, since they are very hard materials, it was difficult to apply the materials to a conventional semiconductor device in which via holes must be formed in a semiconductor substrate by etching. However, according to the structure of the semiconductor device shown in FIGS. 1 and 2, SiC or sapphire can be used as the material of the semiconductor substrate since via holes need not be formed.

Second Embodiment

Figure 3:
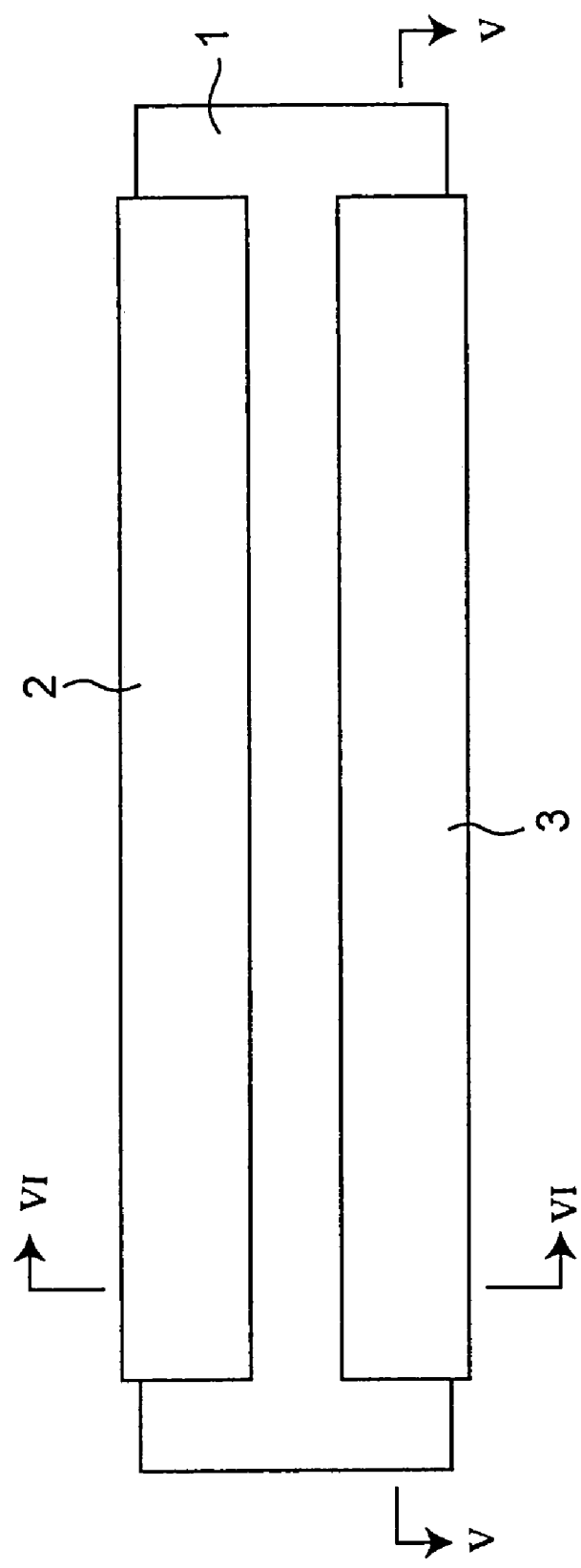
FIG. 3 is a top view showing a layout pattern of semiconductor device according to the second embodiment of the present invention.
Figure 4:
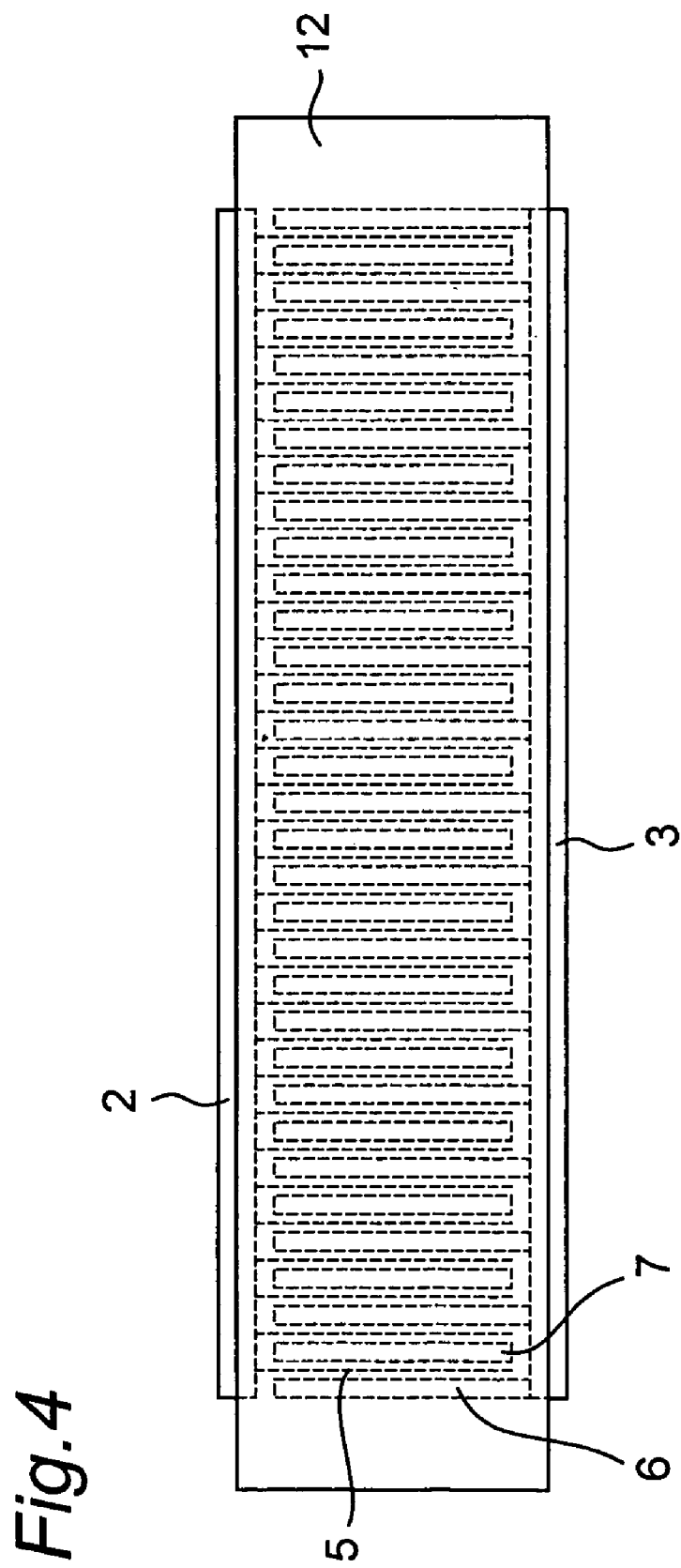
FIG. 4 is a layout pattern view of the semiconductor device according to the second embodiment, which is viewed from the bottom side of the semiconductor device.
Figure 5:
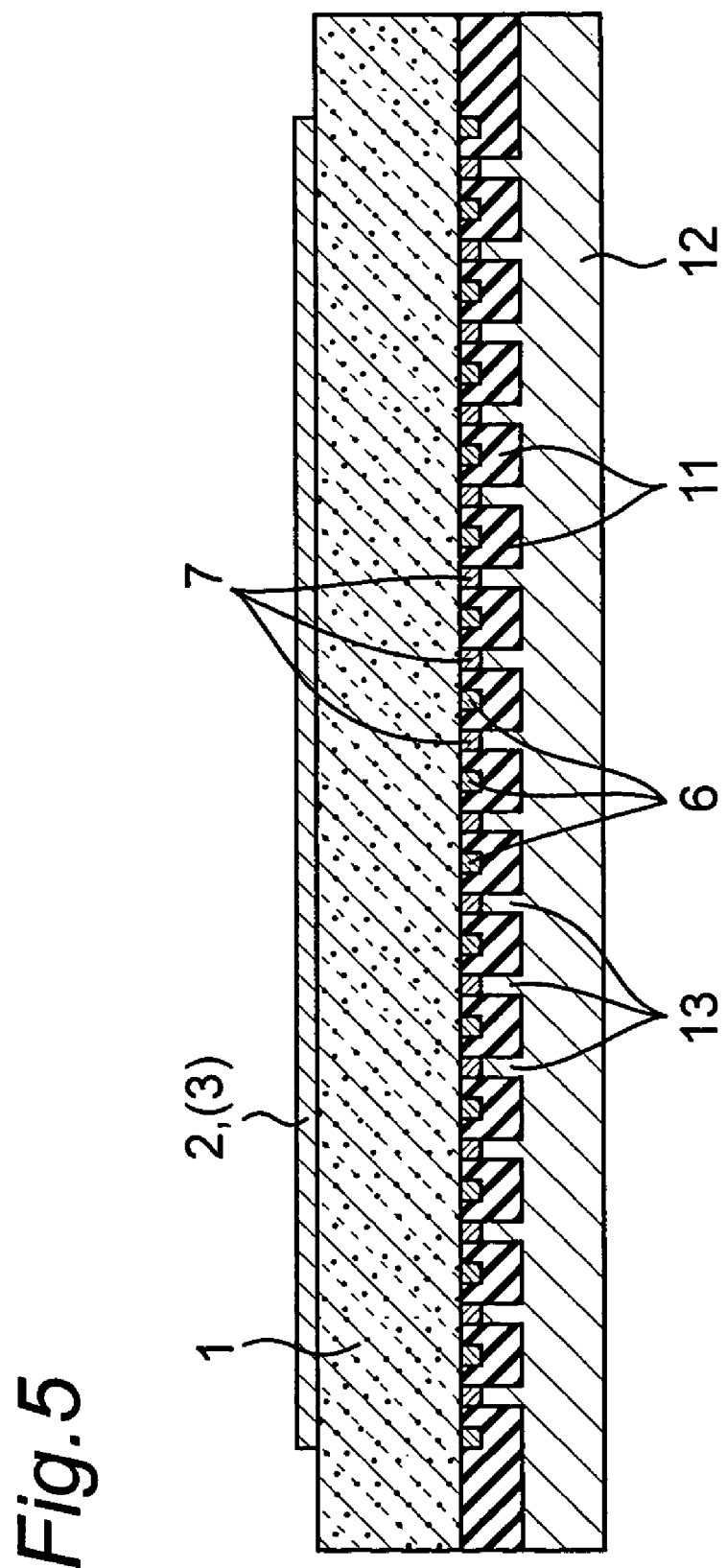
FIG. 5 is a sectional view of the semiconductor device cut along V—V line in FIG. 3.
Figure 6:
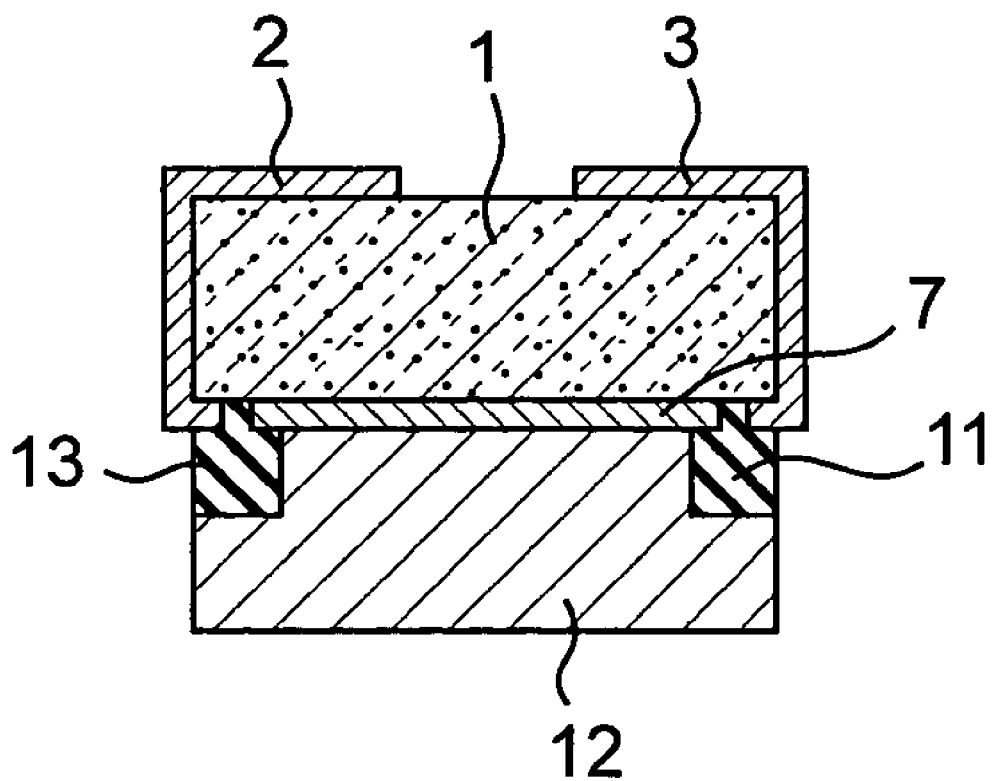
FIG. 6 is a sectional view of the semiconductor device cut along VI—VI line in FIG. 3.

A semiconductor device according to another embodiment of the present invention will be described below with reference to FIGS. 3 to 6. FIG. 3 shows a layout pattern obtained when the semiconductor device of this embodiment is viewed from the top. FIG. 4 shows a layout pattern obtained when the semiconductor device is viewed from the bottom. FIG. 5 is a sectional view of the semiconductor device cut along V—V line in FIG. 3. FIG. 6 is a sectional view of the semiconductor device cut along VI—VI line in FIG. 3.

In this embodiment, as in the first embodiment, as shown in FIG. 5, source electrodes 7 formed on a semiconductor substrate 1 are connected to a chip surface ground electrode 12 through support sections 13, so that the same effect as that of the first embodiment can be obtained.

As shown in FIG. 3, gate and drain pads 2 and 3 are provided on the semiconductor substrate 1. The gate and drain pads 2 and 3 are not only formed on the front plane of the semiconductor substrate 1, but also, as shown in FIGS. 4 and 6, formed to extend from the front plane of the semiconductor substrate 1 to a part of the back plane along the side surface.

FIG. 4 also shows gate electrodes 5, drain electrodes 6, and source electrodes 7 formed on one principal plane of the semiconductor substrate 1. As shown in FIG. 4, in this embodiment, the electrodes 5, 6 and 7 are formed on the plane (lower principal plane of the semiconductor substrate 1 in FIG. 6) that is on the opposite side of the front plane (upper-principal plane of the semiconductor substrate 1 in FIG. 6) of the semiconductor substrate 1 on which the gate and drain pads 2 and 3 are mainly formed.

In this manner, since the gate and drain pads. 2 and 3 are formed on a principal plane different from a principal plane having the operating area 8 in which the electrodes 5 to 7 are formed, the entire area of the principal planes of the semiconductor substrate 1 can be reduced while sufficiently securing an area required for providing the gate and drain pads 2 and 3, and the chip area can be reduced. More specifically, in case that the operating area 8 and the pads 2 and 3 are formed on the same plane of the semiconductor substrate 1, the area of one principal plane on the semiconductor substrate 1 must be larger than at least an area obtained by adding the area of the operating area 8 and the area of the pads 2 and 3. In this embodiment, the operating area 8 and the pads 2 and 3 are formed on the different principal plane, and thus it is possible to reduce the area of the one principal plane.

In the semiconductor device according to this embodiment, the operating area 8 is provided downward so that heat is radiated through the chip surface ground electrode 12. Thus, the semiconductor substrate 1 need not be reduced in thickness, and the manufacturing process of the back plane of the semiconductor substrate 1 can be more simplified.

Also in this embodiment, SiC or sapphire may be used as the material of the semiconductor substrate.

Third Embodiment

Figure 7:
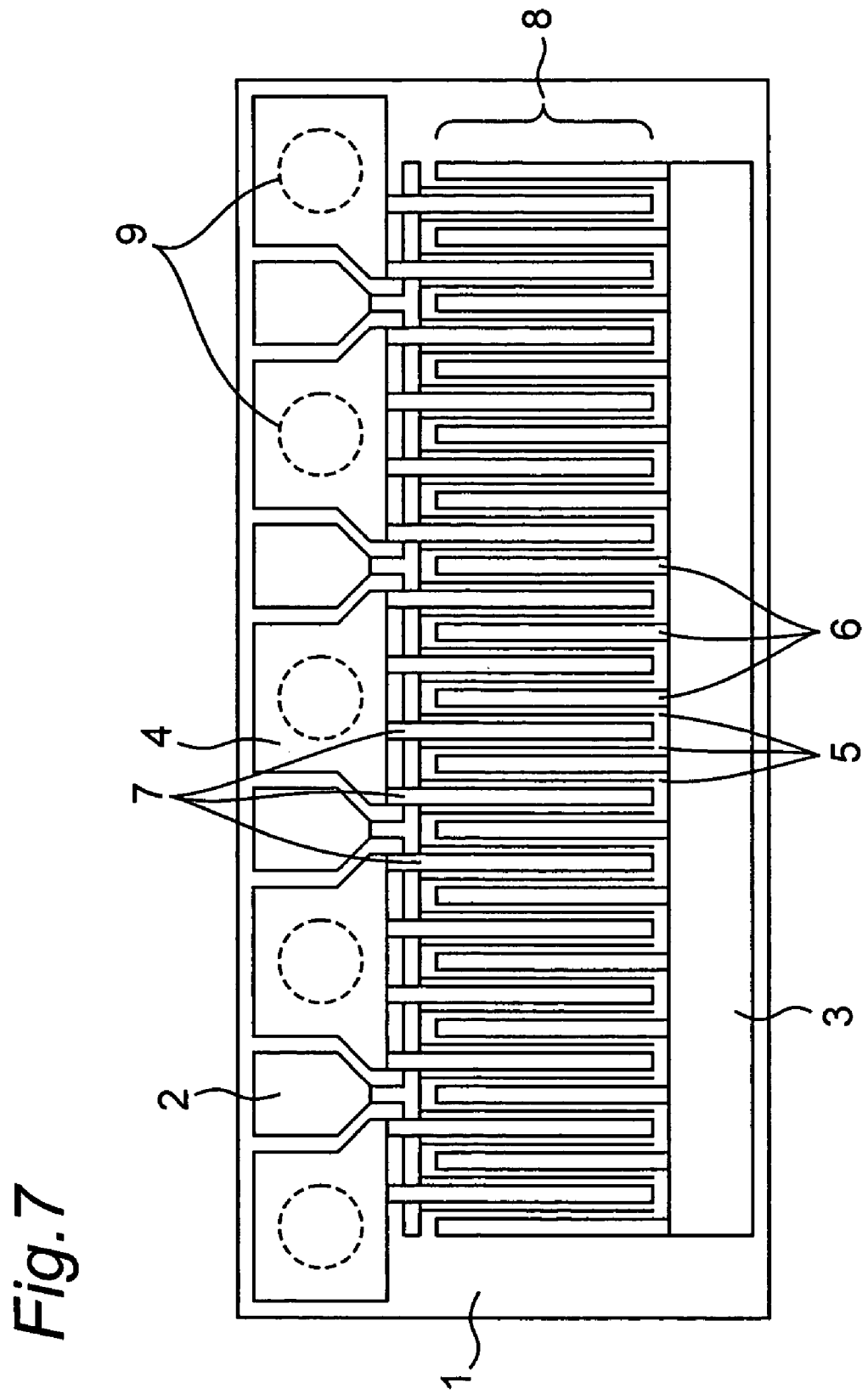
FIG. 7 is a layout pattern view showing a semiconductor device according to the third embodiment of the present invention.
Figure 8:
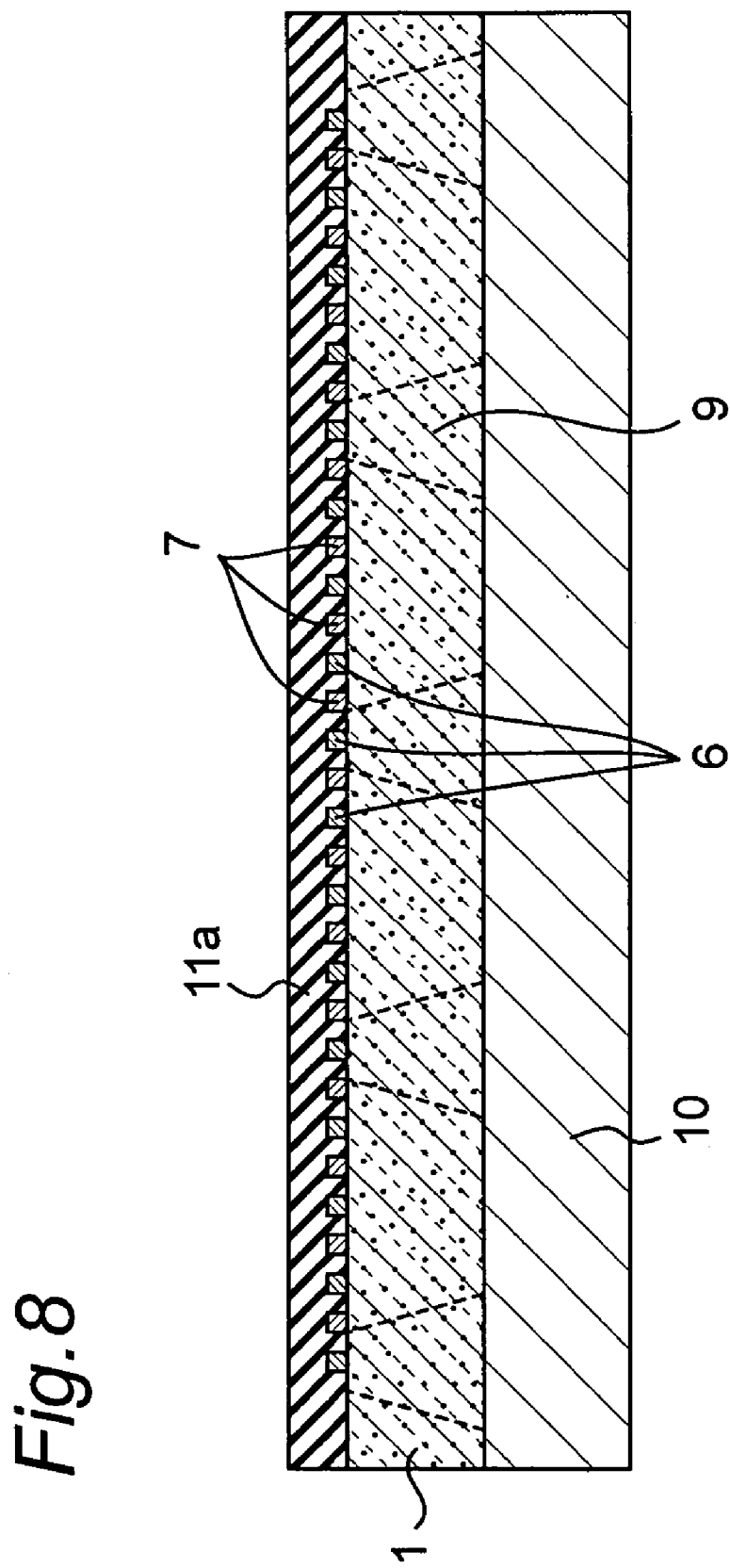
FIG. 8 is a sectional side view showing the semiconductor device of the third embodiment.

In this embodiment, a semiconductor device which can prevent camber in a die-bonding process will be described below with reference to FIGS. 7 and 8. FIG. 7 shows a layout pattern of the semiconductor device according to this embodiment. FIG. 8 is a sectional side view of the semiconductor device. As shown in FIG. 8, in this embodiment, a protecting film 11a which is made of polymer material with a low dielectric constant is formed on a principal plane on which electrodes 5, 6 and 7 on a semiconductor substrate 1 are formed.

Figure 9:
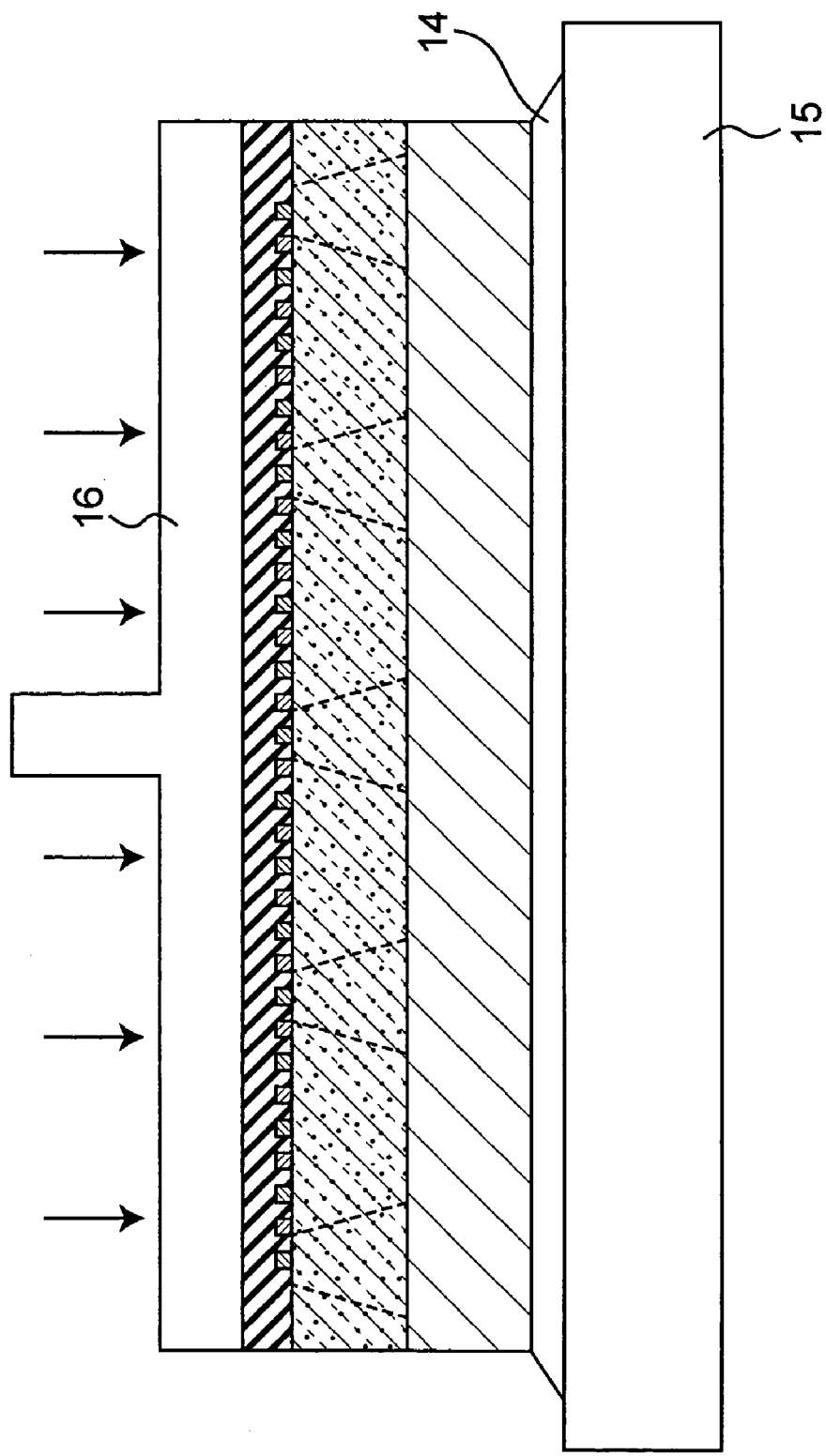
FIG. 9 is a view for explaining a manner in which the front plane of a semiconductor chip is pressed by using a chip handling collet 16.

Hence, since the protecting film 11a made of the low-dielectric-constant polymer material is formed, it becomes possible to press the front plane of the chip by a chip handling collet 16 or the like in a die-bonding process as shown in FIG. 9 so that camber occurring in a die-bonding process can be reduced. Due to the reduction in camber, an AuSn solder between a heat sink 10 and a package 15 on the back plane of the chip is uniformly formed to have a small thickness, and the heat resistance of the device can be reduced.

Fourth Embodiment

Figure 10:
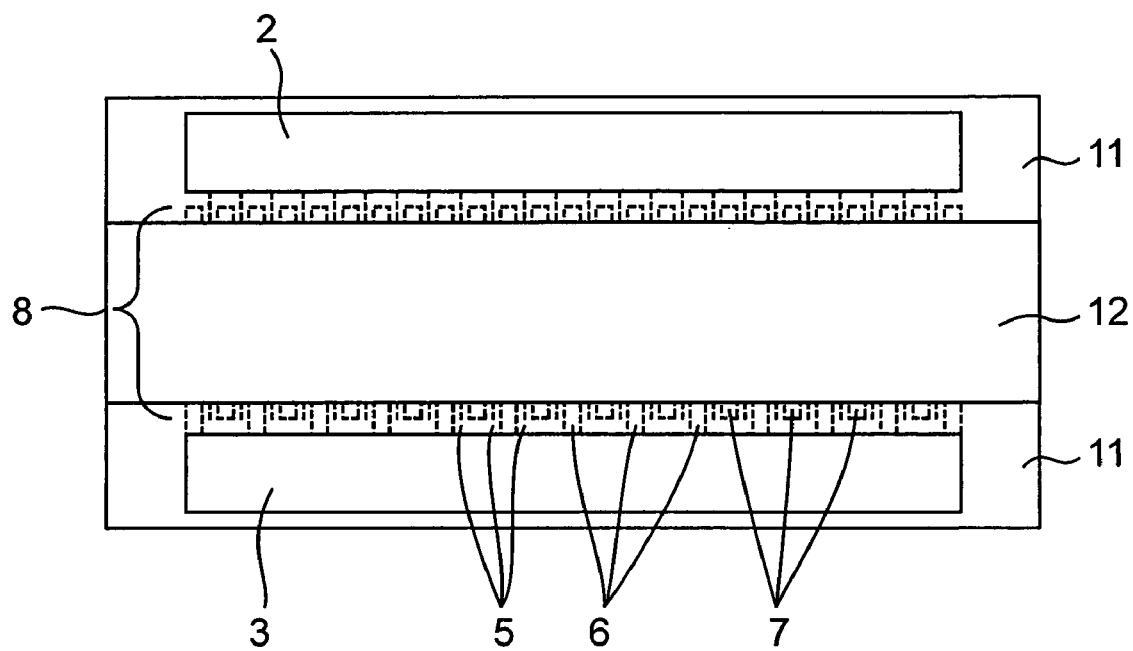
FIG. 10 is a top view showing a layout pattern of the semiconductor device according to the fourth embodiment of the present invention.
Figure 11:
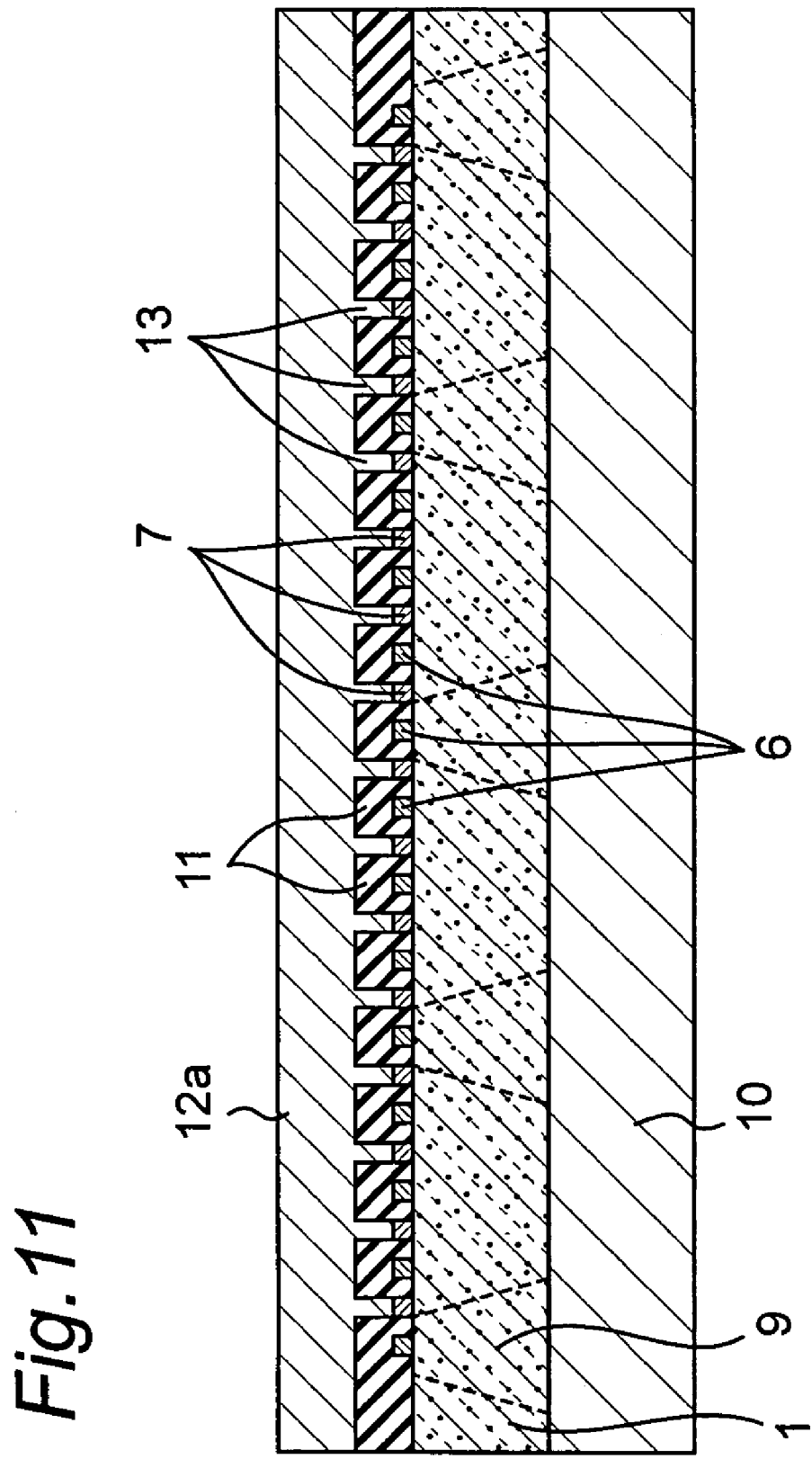
FIG. 11 is a sectional side view showing the semiconductor device of the fourth embodiment of the present invention.

Another configuration of the semiconductor device which can prevent camber in a die-bonding process will be described below with reference to FIGS. 10 and 11. FIG. 10 is a top view showing a layout pattern of the semiconductor device of this embodiment, and FIG. 11 is a sectional side view of the semiconductor device.

In the semiconductor device according to this embodiment, a low-dielectric-constant polymer film 11 is formed to cover a gate and drain electrodes 5 and 6. A chip surface plating layer 12a which is a metal layer obtained by Au plating is formed on the front planes of the low-dielectric-constant polymer films 11 and source electrodes 7. A heat sink 10 which is a metal layer by Au plating is formed on the back plane of the semiconductor substrate 1.

As described above, in the semiconductor device according to this embodiment, the chip surface plating layer 12a is formed on the front plane of the semiconductor substrate 1 and the heat sink 10 formed by the same Au plating as the chip surface plating layer 12a is formed on the back plane. The semiconductor substrate 1 has a structure to be sandwiched by the two Au plating layers. Thus, stress generated by the difference in the thermal expansions is moderated, so that camber can be reduced. The Au plating layer may be replaced with another metal plating layer.

Fifth Embodiment

Figure 12:
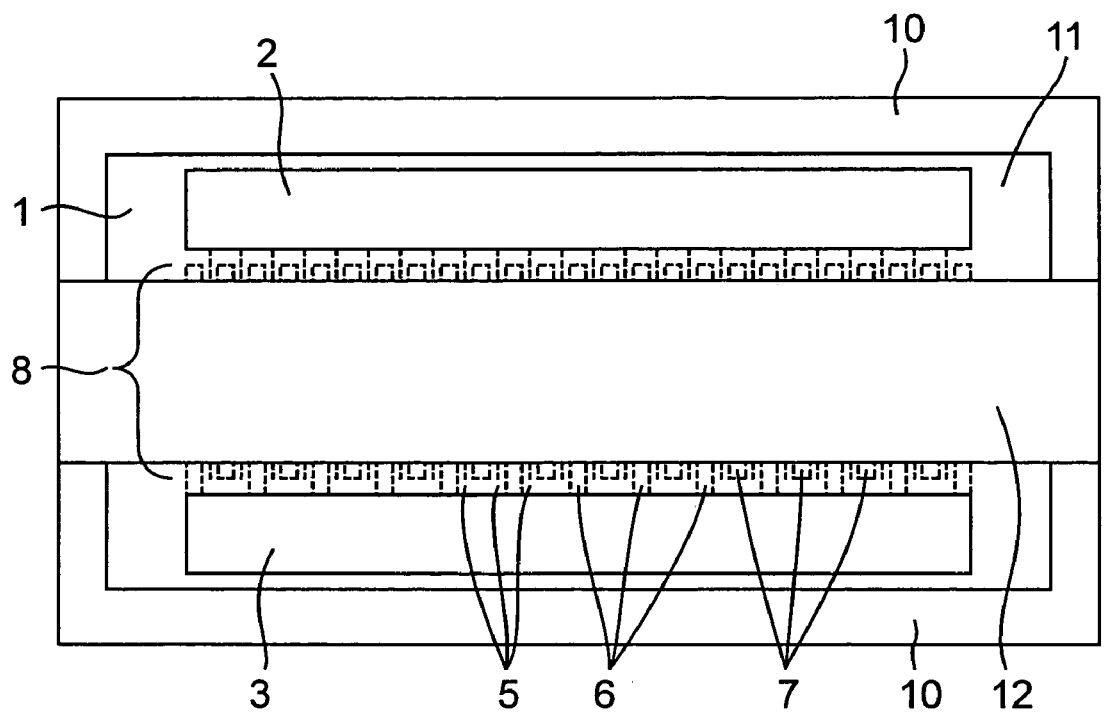
FIG. 12 is a top view showing a layout pattern of semiconductor device according to the fifth embodiment of the present invention.

Still another configuration of the semiconductor device which can prevent camber in a die-bonding process will be described below with reference to FIGS. 12 and 13. FIG. 12 is a top view showing a layout pattern of the semiconductor device according to this embodiment, and FIG. 13 is a sectional side view showing the semiconductor device.

Figure 13:
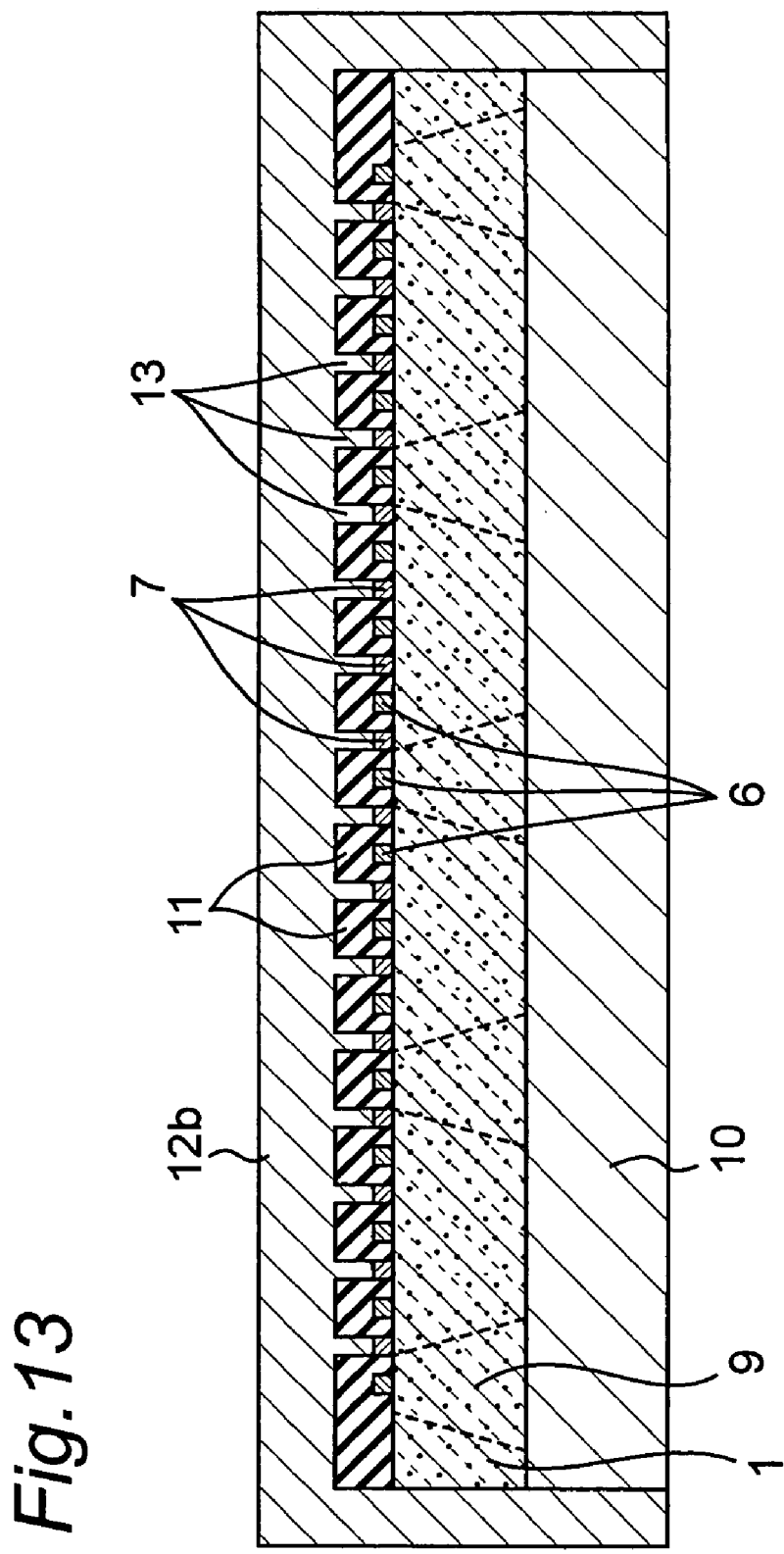
FIG. 13 is a sectional side view showing the semiconductor device of the fifth embodiment of the present invention.

As shown in FIG. 13, in the semiconductor device according to this embodiment, a chip surface plating layer 12b obtained by Au plating is formed on the front plane of a semiconductor substrate 1, and a heat sink 10 obtained by Au plating is formed on the back plane of the semiconductor substrate 1. In addition, the chip surface plating layer 12b is formed to extend to the side wall of the semiconductor substrate 1 and to be connected to the heat sink 10 on the back plane. Thus, the electric contact between the heat sink 10 and the chip surface plating layer 12b is established, and in addition to the effect of the semiconductor device according to the fourth embodiment, it becomes possible to reduce source inductance and heat resistance.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present disclosure relates to subject matter contained in Japanese Patent Application No. 2002-352573, filed on Dec. 4, 2002, which is expressly incorporated herein by reference in its entirety.

What is claimed is:

1. A semiconductor device comprising:
a plurality of semiconductor elements, each semiconductor element having first and second main electrodes and a control electrode;
a semiconductor substrate having a first principal surface on which the first and second main electrodes and the control electrodes are located;
a film at least partially covering the first main electrodes and the control electrodes, not covering the second main electrodes, insulating the first main electrodes and the control electrodes from the second main electrodes, and made of a polymer with a low dielectric constant; and
a chip surface electrode at least partially covering the film, contacting the second main electrodes, and connected to ground potential, wherein the second main electrodes are provided with the ground potential through the chip surface electrode.

2. The semiconductor device according to claim 1, including a first pad connected to the first main electrodes and a second pad connected to the control electrodes, the first and second pads being located on the first principal surface of the semiconductor substrate.

3. The semiconductor device according to claim 2, wherein the semiconductor substrate has a second principal surface opposite the first principal surface and side surfaces joining the first and second principal surfaces, and the first and second pads extend from the first principal surface to the second principal surface along the side surfaces of the semiconductor substrate.

4. The semiconductor device according to claim 2, wherein the semiconductor substrate includes via holes electrically connecting the first pad to the heat sink.

5. The semiconductor device according to claim 1, wherein the semiconductor substrate is one of SiC and sapphire.

6. The semiconductor device according to claim 1, including a heat sink on a second principal surface of the semiconductor substrate, opposite the first principal surface of the semiconductor substrate.

7. The semiconductor device according to claim 6, wherein the heat sink is electrically conductive and is in electrical contact with the chip surface electrode.

8. The semiconductor device according to claim 6, wherein the semiconductor substrate includes via holes electrically connecting respective first main electrodes to the heat sink.

* * * * *